(12) United States Patent
Acar et al.

(10) Patent No.: US 8,409,882 B2
(45) Date of Patent: Apr. 2, 2013

(54) DIFFERENTIAL FET STRUCTURES FOR ELECTRICAL MONITORING OF OVERLAY

(75) Inventors: Emrah Acar, Yorktown Heights, NY (US); Aditya Bansal, Yorktown Heights, NY (US); Amith Singhee, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 713 days.

(21) Appl. No.: 12/617,901

(22) Filed: Nov. 13, 2009

(65) Prior Publication Data
US 2011/0115463 A1 May 19, 2011

(51) Int. Cl.
*H01L 21/66* (2006.01)
(52) U.S. Cl. .......... 438/17; 438/11; 438/14; 438/18; 257/24; 257/48; 324/71.1; 324/322
(58) Field of Classification Search .......... 438/17, 438/11, 14, 18; 257/24, 48; 324/71.1
See application file for complete search history.

(56) References Cited

U.S. PATENT DOCUMENTS

| | | |
|---|---|---|
| 4,516,071 A | 5/1985 | Buehler |
| 4,538,105 A | 8/1985 | Ausschnitt |
| 5,857,258 A | 1/1999 | Penzes et al. |
| 6,323,097 B1 | 11/2001 | Wu et al. |
| 6,462,818 B1 * | 10/2002 | Bareket .................. 356/401 |
| 6,921,946 B2 | 7/2005 | Tao et al. |
| 7,440,105 B2 | 10/2008 | Adel et al. |

OTHER PUBLICATIONS

Allen, R., et al. "The Enhanced Voltage-Dividing Potentiometer for High-Precision Feature Placement Metrology." IEEE Transactions on Instrumentation and Measurement. vol. 45, No. 1. Feb. 1996. pp. 136-141.
Srivastava, S., et al. "A Novel Electrical Test Structure for Measuring Misalignment Between Polysilicon and Active Area in MOS VLSI Technologies." Proceedings of the Fourth CSI/IEEE International Symposium an VLSI Design. 1991 IEEE. Jan. 1991, pp. 290-292.
Vitomirov, L., et al. "Lateral Power MOSFET Low-Doped Drain (LDD) Misalignment Test Structure." Proc. IEEE 1997 International Conference on Microelectronic Test Structures. vol. 10, Mar. 1997. pp. 31-34.

* cited by examiner

*Primary Examiner* — Thinh T Nguyen
(74) *Attorney, Agent, or Firm* — Tutunjian & Bitetto, P.C.; Preston Young

(57) ABSTRACT

A method and apparatus for determining overlay includes an array of electronic devices having structures formed in a plurality of layers and such that a device on a first end of the array includes an offset from a position of a device on a second end of the array. A measurement device is configured to measure electrical characteristics of the devices in the array to determine a transition position between the electrical characteristics. A comparison device is configured to determine an overlay between the layers based on a device associated with the transition position.

8 Claims, 8 Drawing Sheets

DIFFERENTIAL FET STRUCTURES FOR ELECTRICAL MONITORING OF OVERLAY

BACKGROUND

1. Technical Field

The present invention relates to electronic structures and methods for fabrication and more particularly to devices and methods which electrically characterize process variations due to mask misalignment.

2. Description of the Related Art

As device size shrinks aggressively in advanced very large scale integration (VLSI) technology, increased process variation causes devices to behave differently from intended operation. For example, the post-fabrication terminal current, at certain terminal voltages, for a device may differ from desired current.

One significant cause of variability is non-rectangular fabrication of a device's gate (PC) and active diffusion (RX) regions. This non-rectangularity emerges from extremely shrunk device sizes and imperfect lithographic processes. A device's region of interest (ROI) is the PC overlap of an RX region. Several fabrication mask optimization techniques such as Optical Proximity Correction (OPC) and Resolution Enhancement Techniques (RET) have been developed and aggressively optimized to achieve near rectangular ROI. PC and RX regions are formed at during fabrication steps. A lithography tool has to physically pick a mask for the formation of each region. This can result in overlay error in mask alignment on a wafer. This overlay error is becoming closer in magnitude to smallest relevant dimensions on a wafer such as PC pitch (distance between two PCs). Hence, maintaining a rectangular ROI is becoming an increasingly difficult task.

Overlay variation due to fabrication tools while aligning a mask with a wafer and patterning occurs between different layers (PC-RX, RX-CA, PC-CA, etc.). For example, the impact of PC-RX overlay results in variations in device width and induced overlay with other critical layers (e.g., contacts layers (CA)). The impact of PC-CA or RX-CA overlay includes hard defects and increased resistance/capacitance. PC-RX-CA overlay is a growing concern with reduced device widths (RX), and reduced PC pitch in static random access memory (SRAM) cells and other structures.

FIG. 1 illustrates a device 10 with non-rectangular ROI due to misalignment between PC and RX masks. As shown in FIG. 1, misalignment 15, 17 between PC and RX layers can affect the device characteristics by modifying the device width resulting in variability in circuit functionality, varying distance between PC and contacts (CA) which introduces variation in parasitic resistance and capacitances, varying CA overlap of RX which introduces variation in contact resistance, and causing hard defects (e.g., PC to CA shorts).

A current practice is to fabricate some pattern at every different mask level and measure the distance between every pair of patterns. Any deviation in the distance from the designed distance is the measure of overlay error. These measurements are made typically using optical metrology tools, such as a Scanning Electron Microscope. This optical measurement technique is very time consuming. As a result, practical implementations are limited to only a few measurements per wafer. Also, the optical measurement, does not allow for any adaptive self-repair schemes in the electrical circuit.

Traditional measurements are often supplemented by measuring current-voltage characteristics of several devices to measure variability. Measurements using the traditional approaches include the electrical variability due to all the sources of local and global process variations. Local sources include threshold voltage and current variations due to random dopant fluctuations, PC line-edge roughness, etc. Global sources include lithographic variations such as variation in focus, dose, etc. in PC/RX as well as etch variations. It becomes extremely difficult to isolate the variations due to overlay alone, to qualify the fabrication tool and to characterize the technology.

SUMMARY

For a given fabrication tool, an estimate of electrical impact of overlay during a technology ramp-up cycle for tool qualification and technology characterization would be advantageous. For example, knowing the electrical impact of an OPC resolution to make sharp RX corners, allowed PC pitch, allowed differences in widths of two neighboring stacked devices, etc. would be helpful.

A method and apparatus for determining overlay includes an array of electronic devices having structures formed in a plurality of layers and such that a device on a first end of the array includes an offset from a position of a device on a second end of the array. A measurement device is configured to measure electrical characteristics of the devices in the array to determine a transition position between the electrical characteristics. A comparison device is configured to determine an overlay between the layers based on a device associated with the transition position.

An apparatus for determining overlay includes an array of electronic devices having structures formed in a plurality of layers and such that a device on a first end of the array includes an offset from a position of a device on a second end of the array. A measurement device is configured to measure electrical characteristics of the devices in the array to determine a transition position between the electrical characteristics. A comparison device is configured to determine an overlay between the layers based on a device associated with the transition position.

A built-in circuit for determining overlay includes an array of electronic devices having structures formed in a plurality of layers and such that a device on a first end of the array includes an offset from a position of a device on a second end of the array. A shift register is coupled to the electronic devices and configured to sequentially send an input signal to devices in the array. A measurement device is configured to measure electrical characteristics of the devices in the array to determine a transition position between the electrical characteristics in accordance with an output signal. A comparison device is configured to determine an overlay between the layers based on a device associated with the output signal.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
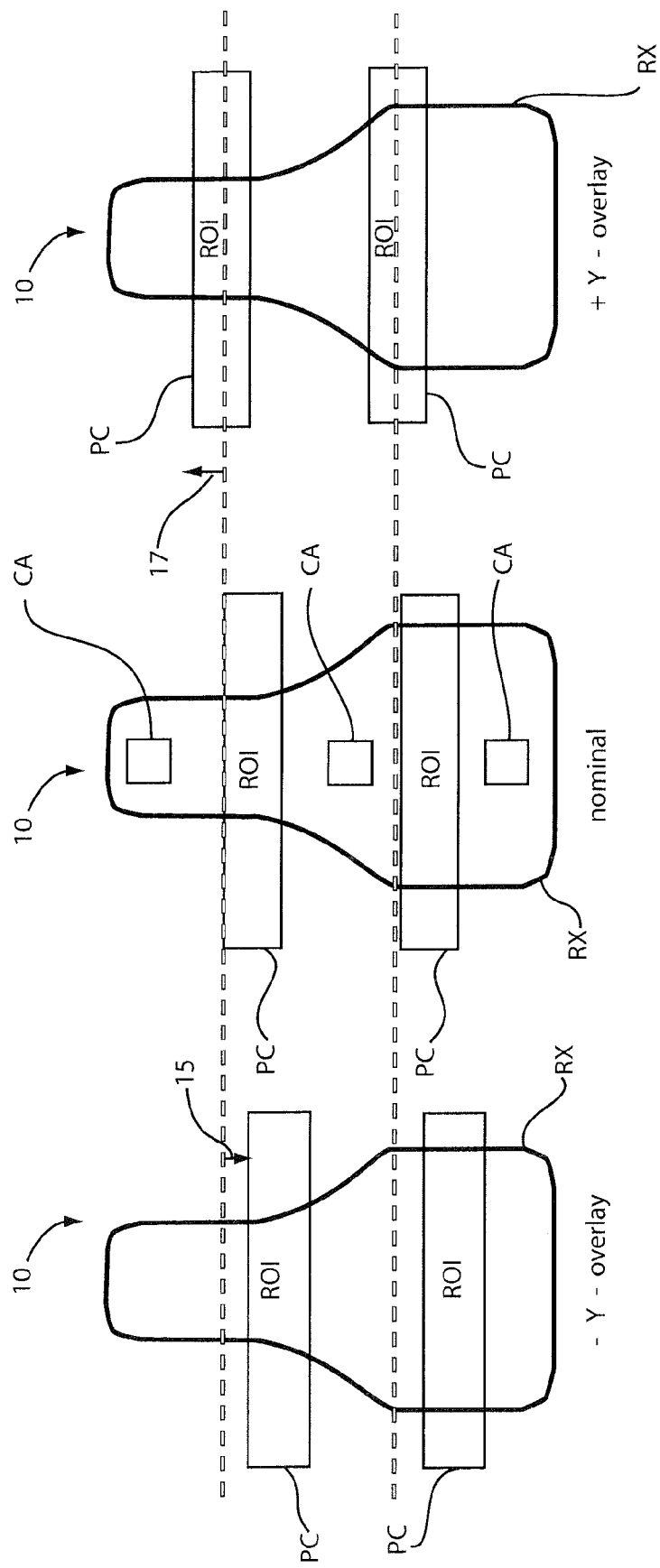
FIG. 1 is a layout showing a negative Y-overlay, a nominal layout and a positive Y-overlay between an active area and a gate.

In accordance with the present principles, a new and useful approach is provided to isolate (from other sources or variations) and electrically characterize misalignment in gate and active area mask layers. One approach includes employing differential device structures to accurately characterize the implicit overlay occurring during manufacturing. An output voltage corresponding to misalignment is generated which can be used in several ways to qualify/characterize the tools/technology as well as diagnose and repair a circuit.

In one embodiment, differential device layout structures (e.g., in gate and active area shapes) are employed to electrically characterize a Y-overlay. In another embodiment, differential device layout structures (e.g., in gate and active area shapes) are employed to electrically characterize an X-overlay. A built-in test circuit is provided to produce digital or analog output corresponding to an overlay. The measured overlay value is employed as input for on-chip diagnosis/repair of the circuit.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

An integrated circuit chip may be fabricated in accordance with the present principles. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Throughout this disclosure, gate lines are considered as horizontal gate lines and active area shapes are considered as vertical. However, it should be understood that this orientation is non-limiting and that the present embodiments include orthogonal processes with vertical gate lines and horizontal active area shapes, among other mask layers, device structures and other aligned features in integrated circuit manufacture.

Figure 2:
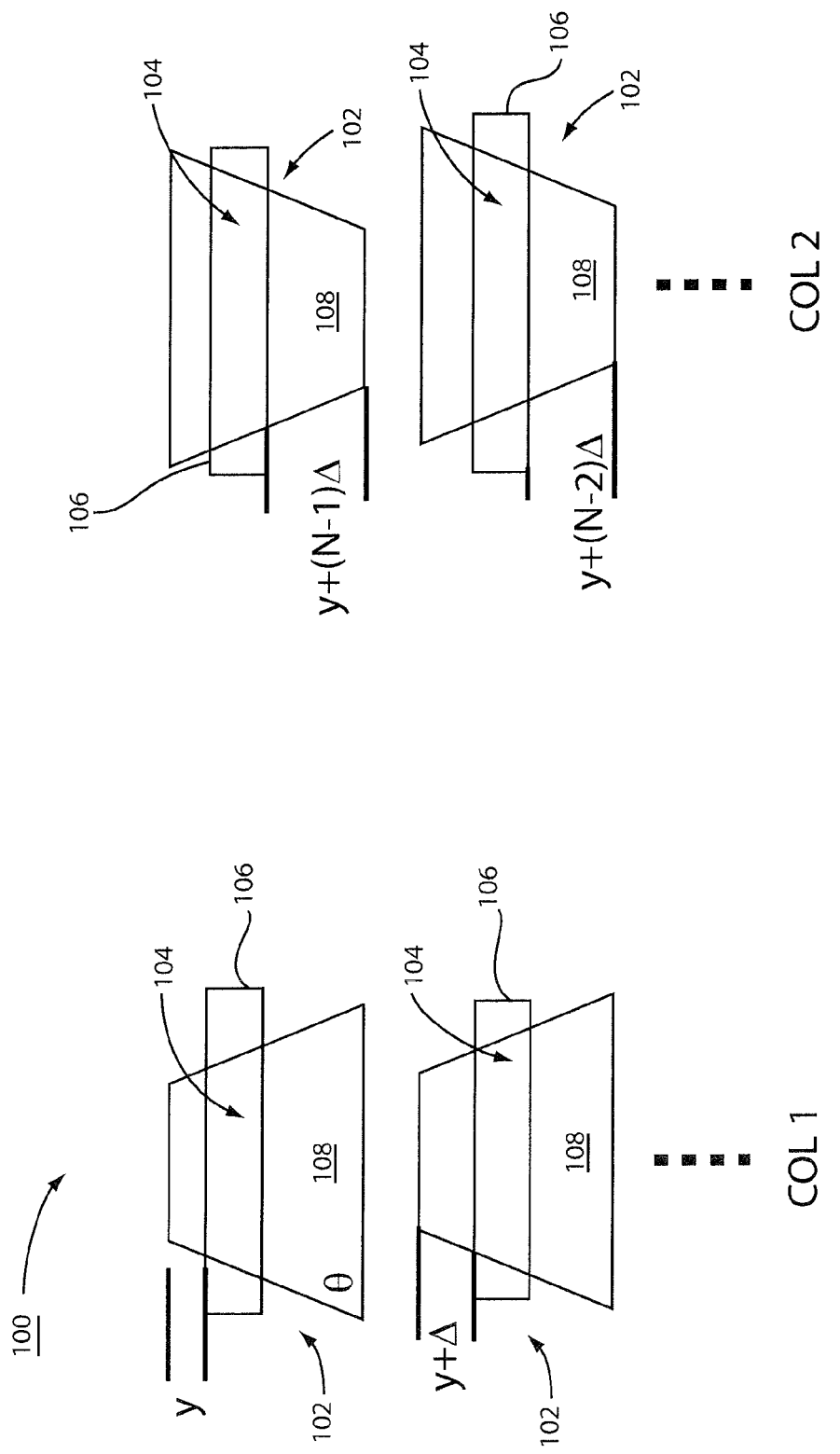
FIG. 2 shows an illustrative array of devices with asymmetric shapes for employing electrical characteristics to determine Y-overlay in accordance with the present principles.

Referring now to the drawings in which like numerals represent the same or similar elements and initially to FIG. 2, differential device layout structures 100 are shown to characterize mask misalignment in the Y-direction, i.e., Y-overlay. In this illustrative embodiment, two columns of devices 102 are shown such that a region of interest (ROI) 104 (where a gate overlaps an active area) is either trapezoidal, 'T-shaped' (or inverse 'T-shaped') or other shape, preferably asymmetric about at least one axis. Active regions 108 have inverted or reversed configurations such that a relationship in operating characteristics is maintained between the corresponding device in each row between the two columns (COL 1 and COL 2). In each column, gate lines 106 are deliberately shifted vertically from its neighboring row devices by a fixed distance of $\Delta Y$. If, for example, there are eleven devices in each column, and an overlay can be measured in the range of $\pm 10$ nm, then $\Delta Y=2$ nm in this example. It should be determined that the currents through neighboring devices (e.g., field effect transistors (FETs)) should be noticeably different. To increase the sensitivity of current to $\Delta Y$, an angle $\theta$ needs to be reduced in the trapezoidal structures for ROIs 104.

Figure 3:
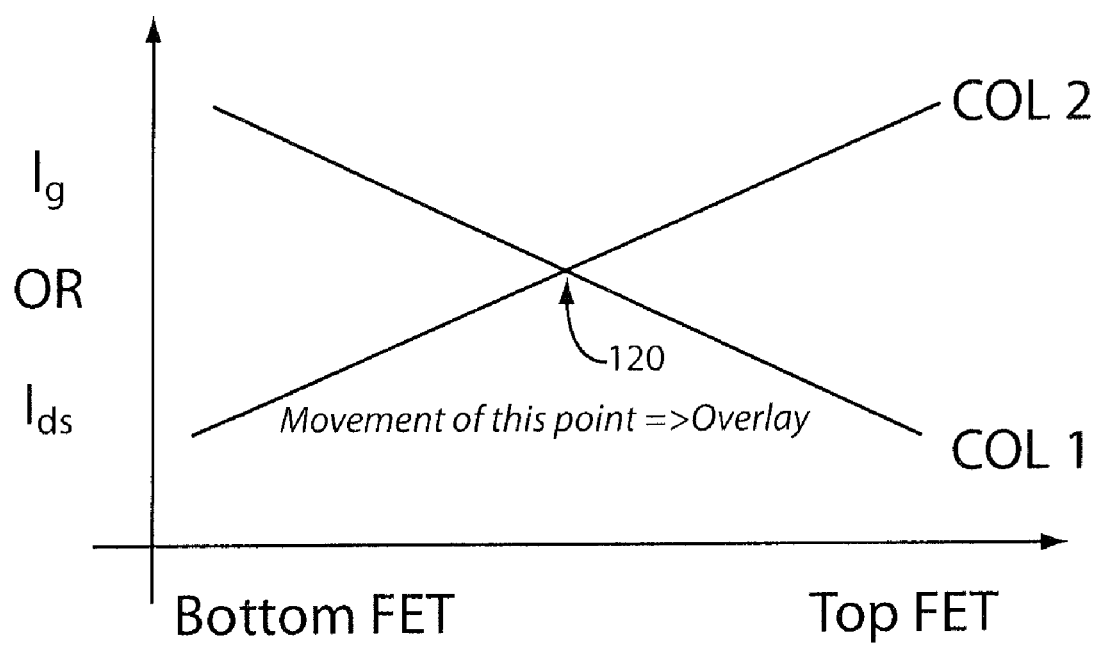
FIG. 3 shows a plot of electric characteristics measured in the array of FIG. 2 for determining a position of equal currents to determine a device indicating an overlay magnitude in accordance with the present principles.

Referring to FIG. 3, in a nominal case, currents through the columns can be plotted. The currents are illustratively depicted as a gate current ($I_g$) or a drain to source current ($I_{ds}$) for a first column COL 1 and a second column COL 2. Note that the current plots cross each other for a center row only in the nominal case. The current plots include this relationship as a result of the selection of shapes of the devices (e.g., active areas 108) between the two columns. It should also be understood that other electrical parameters may be employed instead of or in addition to $I_g$ and/or $I_{ds}$. Post-fabrication, due to overlay, the active areas 108 (RX) (or gates 106 (PC)) in the whole array of devices will move up or down (safely assuming that overlay error is not local) resulting in the two curves COL 1 and COL 2 moving in opposite directions thereby moving their point of intersection. A point of intersection 120 corresponds to the row for which the currents are matching. A net $\Delta Y$ in that row from the center row corresponds to the Y-overlay. This process can be automated for the detection of a matching row.

It should be understood that the intersection point 120 may correspond to a pair of devices with the same exact current. However, this may not be true in all cases since the devices have discrete shifts of $\Delta Y$, while overlay can take up any value in between. So, to compensate a pair of device may be selected with the most similar currents (instead of matching currents), or two pairs of devices may be selected, one with the smallest positive difference in current and another with the smallest negative difference, and then an interpolation may be performed to determine the overlay as a linear function of the current difference to get the overlay corresponding to zero current difference.

Figure 4:
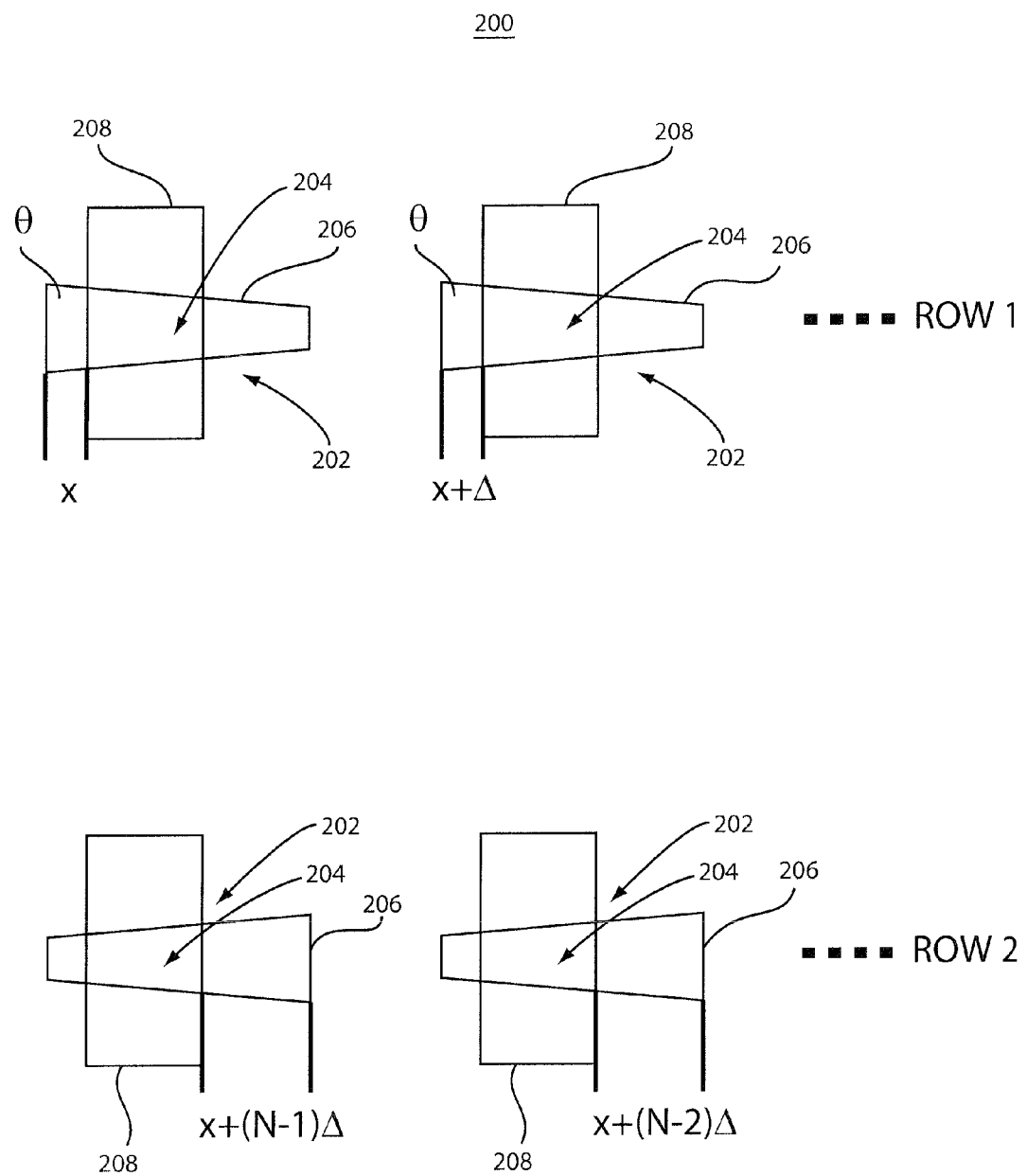
FIG. 4 shows an illustrative array of devices with asymmetric shapes for employing electrical characteristics to determine X-overlay in accordance with the present principles.

So if, e.g., two device pairs have $\Delta Y$'s of $\Delta 1$ and $\Delta 2$, and current differences of $\Delta I1$ and $\Delta I2$, then the overlay is $\Delta I2*(\Delta 2 \times \Delta 1)/(\Delta I1+\Delta I2)+\Delta 1$. These differences may be accounted for in the selection of shapes, in the selection of devices, device pairs or other criteria Referring to FIG. 4, differential device layout structures 200 are shown to characterize mask misalignment in the X-direction, i.e., X-overlay. In this illustrative embodiment, two rows of devices 202 are shown such that a region of interest (ROI) 204 (where a gate overlaps an active area) is trapezoidal (PC-RX overlap region) such that PC is not a parallelogram. The current plots include an inverse (e.g., reversed shapes) relationship such that global shift of row with respect to the other causes current to increase in one row and decrease in the other as a result of the selection of shapes of the devices (e.g., gates 206) between the two rows. Compensation of overlay shifting effects on current may need to be included. In each row, gate lines 206 are deliberately shifted horizontally by a fixed distance of ←X. It should be determined that the currents through neighboring devices (e.g., field effect transistors (FETs)) should be noticeably different.

In the nominal case, currents can be plotted as in FIG. 3. The currents may include a gate current ($I_g$) or a drain to source current ($I_{ds}$) for a first row ROW 1 and a second row ROW 2. Note that the current plots cross each other at a center point only in the nominal case. It should also be understood that other electrical parameters may be employed instead of or in addition to $I_g$ and/or $I_{ds}$ and compensation for overlay needs to be accounted for. In post-fabrication, due to overlay, the active areas 208 (RX) (or gates (PC)) in the whole array of devices will move right or left (safely assuming that overlay error is not local) resulting in the two curves moving in opposite directions thereby moving their point of intersection as in FIG. 3. The point of intersection again corresponds to the column for which the currents are matching. A net ΔX in that column from the center column corresponds to the X-overlay. This process can be automated for the detection of a matching column.

Figure 5:
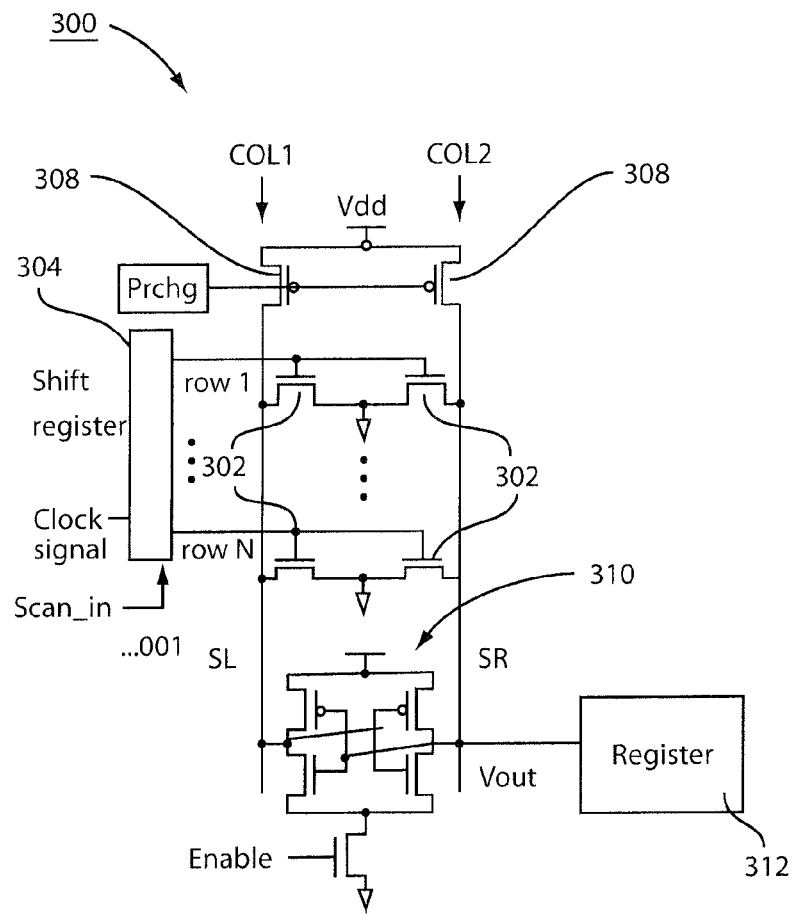
FIG. 5 is a schematic diagram of a digital circuit for determining overlay in accordance with the present principles.

Referring to FIG. 5, a circuit 300 preferably is built-in on a wafer or chip where overlay measurements are to be made. The built-in circuit 300 detects the row (or column) for which currents of the devices match. Circuit 300 is suitable for digital detection, and is adapted to be applied based on how overlay information is used and fed back to repair the circuit, if needed.

Transistors 302 are provided in two columns COL 1 and COL 2. The transistors 302 may be connected at their gates, sources and drains as shown. The transistors 302 include gates and active area layout shapes and regions as depicted in FIG. 2 (or correspondingly to FIG. 4). A shift register 304 is used to select each row (rows 1-N) in order. A scan-in signal provides input bits to the rows through the shift register 304. An Enable signal enables an output circuit 310. In one embodiment, output circuit 310 includes a sense amplifier 310 having two PFETs and two NFETs and is responsive to sense left (SL) and sense right (SR) signals. The sense amplifier 310 outputs Vout to a register 312. A precharge signal (Prchg) is employed to activate/deactivate PFETs 308 to connect a supply voltage node (Vdd) to signal line SL or signal line SR. In every measurement (or clock cycle) as metered by a Clock signal, the following signal order is employed:

Prchg:='0' and Enable:='0'=>SL and SR are pre-charged to '1'.

Prchg:='1' & a row is enabled=>SL and SR start discharging.=>The discharging current will depend on relative strength of two transistors in a selected row.

When a sufficient voltage difference between SL and SR is achieved, Enable:='1'=>Vout (full rail-to-rail swing—'0' or '1'—is noted).

Rows are selected in order and the transition of Vout from '0' to '1' or vice-versa corresponds to the row which corresponds to the overlay value.

Figure 6:
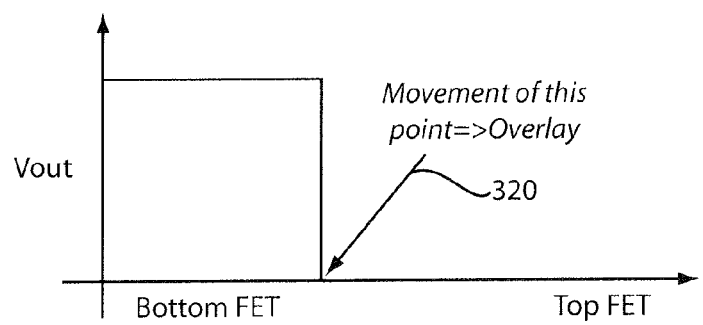
FIG. 6 is a plot of an output of the circuit in FIG. 5 for determining a device indicating an overlay magnitude in accordance with the present principles.

The sense amplifier 310 is preferably a full rail-to-rail swing sense-amplifier. The arrangement of FETs in column 1 and column 2 measures the overlay and generates a corresponding output signal by employing physical layout shapes and predetermined device offsets to compute a current difference between transistors. For example, if five rows (row 1-5) are provided then an input bit sequence (Scan_in) to the shift register 304 is 00001, 00010, 00100, 01000, 10000 and if the output sequence is 0, 0, 0, 0, 1; that means, overlay corresponding to net ΔY in the $5^{th}$ row has occurred. FIG. 6 shows a graphical representation of a transition point 320 where Vout changes from 1 to 0 for a transistor position in a column of transistors between a bottom FET and a top FET. The FET in a corresponding row position corresponds to the overlay or offset between fabrication masks or device features.

Figure 7:
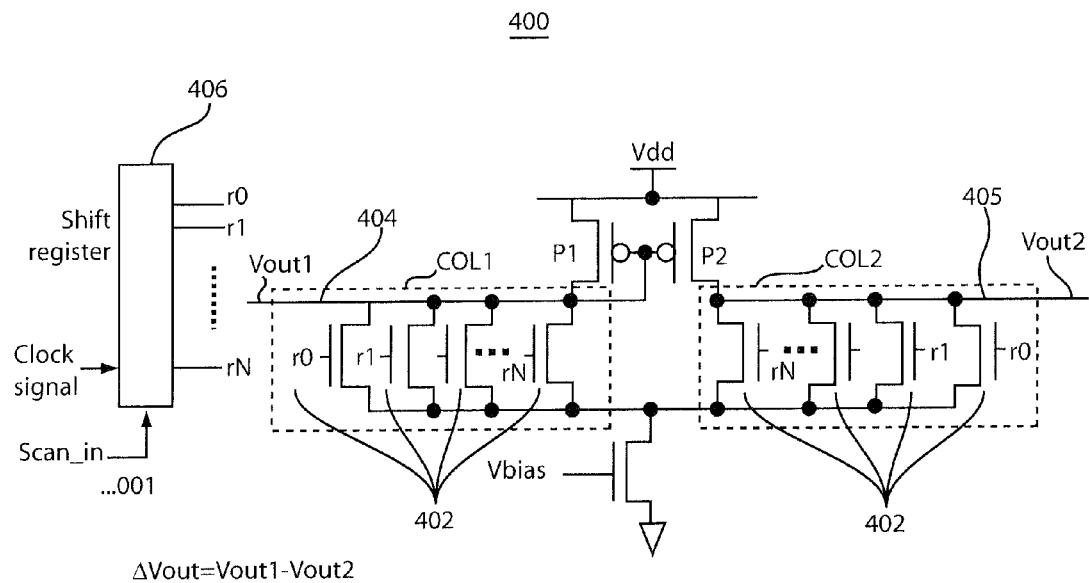
FIG. 7 is a schematic diagram of an analog circuit for determining overlay in accordance with the present principles.

Referring to FIG. 7, a circuit 400 for analog detection is preferably built-in on a wafer or chip where overlay measurements are to be made. Transistors 402 in two columns COL 1 and COL 2 are connected in parallel between two rails as shown. A top rail 404 in column 1 carries a Vout 1 signal, and a top rail 405 in column 2 carries a Vout 2 signal. A shift register 406 is used to select each row (r1-rN) in order using a Scan_in input and Clock signal. Vbias is such that when a bottom transistor is in saturation, ΔVout (=Vout 1−Vout 2) will be proportional to the current difference between COL 1 and COL 2. Supply voltage Vdd connects to top rails 402 and 404 through PFETs P1 and P2, respectively.

Figure 8:
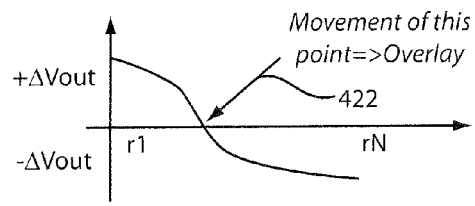
FIG. 8 is a plot of an output of the circuit in FIG. 7 for determining a device indicating an overlay magnitude in accordance with the present principles.

Referring to FIG. 8, a sample output plot is illustratively depicted. The plot shows ΔVout versus position of transistors. When ΔVout crosses zero at point 422, a corresponding transistor location yields the magnitude of the overlay for the device.

Referring again to FIG. 7, a reference row 'r0' with two transistors includes a rectangular gate (PC) and active area (RX). r0 is preferably employed as a reference to remove the variability between active PMOS loads P1 and P2. ΔVout when r0 is selected will be treated as a reference. Ideally, $\Delta Vout|_{r0}=0$, however, due to process variations in P1 and P2, there can be some error which is removed by using r0.

Figure 9:
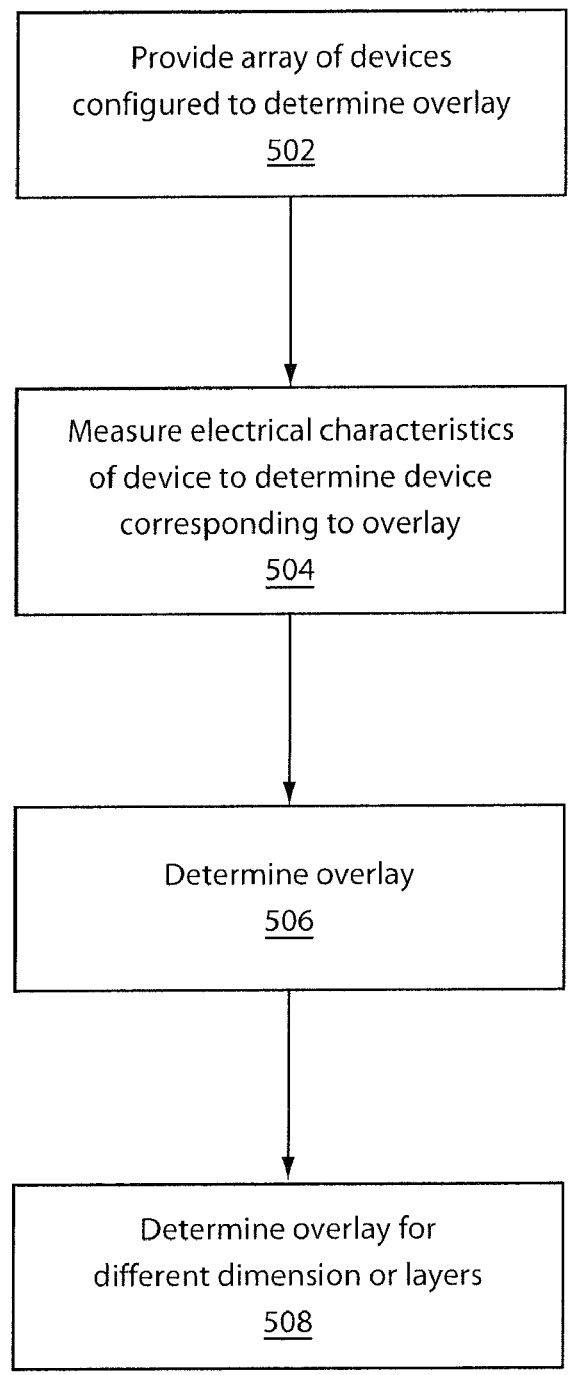
FIG. 9 is a block/flow diagram of a method for measuring overlay in accordance with the present principles.

Referring to FIG. 9, a method for determining overlay is depicted in accordance with one illustrative embodiment. In block 502, an array of electronic devices is provided having structures formed in a plurality of layers. The layers may include functional shapes in at least one of active area regions, gates and contacts associated with the formation of the devices. The shapes of the features in the layers may be formed to provide different electrical characteristics of the devices measured. For example, the array of electronic devices includes shapes within patterned layers to adjust measured electrical characteristics. These shapes may include forming at least one of a trapezoid, a T-shape or other asymmetric shape (e.g., asymmetry in at least one axis).

A device on a first end of the array includes an offset from a position of a device on a second end of the array. The offset may be a same distance between devices or may include a known distance between devices. In this way, once a particular device is identified, as described below, a distance measure is determined for the overlay. Note that the distance measure corresponds to the deliberate offset made in that row (or column) during design. The array may include at least two columns for determining a Y-overlay, and/or include at least two rows and determine an X-overlay (or both).

In block 504, electrical characteristics of the devices in the array are measured to determine a transition position between the electrical characteristics. The devices preferably include field effect transistors, and the electrical characteristics of the devices that are measured may preferably include one of gate current and drain to source current. The transition position may include an intersection on a plot of current between devices at two positions in the array (e.g., COL 1 and COL 2 as depicted in FIG. 3). A shift in the intersection point from a nominal position includes which device corresponds to the overlay magnitude. Compensation for overlay shifts may be needed as well. Different electrical characteristics may be achieved between rows or columns by reversing a shape (flipping a trapezoid or other shape) of one of the areas to get a different electrical response (e.g., current). Other characteristics may also be altered between device rows or columns, e.g., doping levels, sizes, etc.

In block 506, an overlay between the layers is determined based on a device associated with the transition position. For example, a shift in the intersection point is correlated to a particular device position. If there are ten devices (each with a 10 nm spacing) and a third device corresponds to the transition point, then the overlay is 30 nm because the third device is 30 nm from a nominal position (three spacings). The scale may be change (e.g., more or less resolution) depending on, e.g., the device density and offset.

In block 508, the overlay may be determined for different layers in the integrated circuit structure. Different devices may be fabricated at different levels to provide electric characteristics between other adjacent or non-adjacent levels.

The present principles provide many possible applications for electrically characterizing an overlay. Such applications range from tool and technology qualification to chip characterization and binning. These applications may further include repairing circuit characteristics, e.g., performance, functionality, leakage, etc. by dynamically tuning a threshold-voltage (Vt) of devices. This may be done by, e.g., changing a body bias of a transistor by changing its back-gate voltage.

The present embodiments provide enhanced overlay sensitivity due to engineered diffusion regions and gate shapes and provide a differential scheme using offsets for devices or device components. The present embodiments may be used to cancel out any other global variations and provide direct correlation between electrical measurements to overlay or offset by looking at identified transistors where currents are matched. In particularly useful embodiments, directions of overlay variation can be measured in two directions to determine a two dimensional offset vector. The overlay can be measured using the same array in two dimensions, and rotational overlay can be easily translated to Cartesian coordinates using the two dimensional approach.

Advantageously, the determination of overlay can be provided by built-in test circuitry. The test circuitry includes only a small number of FETs (this is very little overhead given that chips are heading towards 50 billion FETs on a chip). The present principles are useful during technology ramp-up for tool qualification/characterization, ground rule characterization (PC pitch, RX mismatch in stacked FETs, etc.), and faster design closure with accurate overlay models. The present embodiments enable potential on-chip adaptive schemes to increase robustness and yield by providing overlay distribution information. The present methods are useful in process/layout quality measurements and statistical yield analysis.

Figure 10:
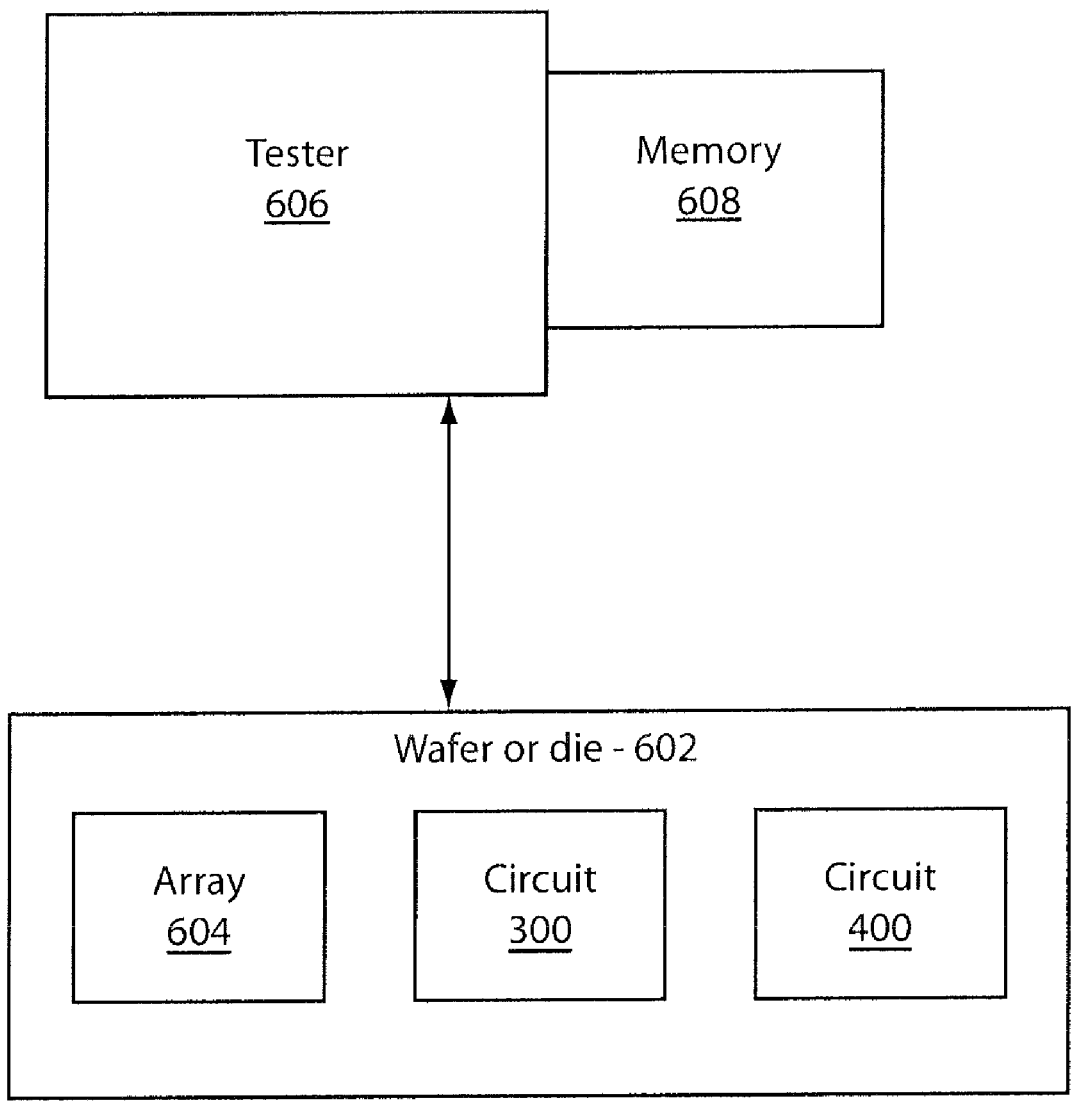
FIG. 10 is a block/flow diagram of a system for measuring overlay in accordance with the present principles.

Referring to FIG. 10, a system 600 for measuring overlay is illustratively depicted. System 600 may be employed, for a given fabrication tool, to analyze the electrical impact of overlay during a technology ramp-up cycle, to determine how much overlay varies across a wafer and within a die, to determine the electrical impact of overlay variations for circuit design blocks (worst-case on a die), etc. This is useful for estimating stripping bounds for resist, etc. System 600 may be helpful in characterizing technologies. For example, the system 600 may be employed to determine permitted width differences of stacked FETs, the importance for layer differences or offsets in FETs or other layers, and devices (e.g., latches). Overlay measurements provided by system 600 may include the determination of OPC resolution, e.g., to make sharp corners in active regions, determine allowed gate pitches, etc. These analyses need to be able to measure and characterize overlay accurately.

System 600 includes a wafer or die 602 having an array 604 of devices formed thereon in accordance with the present principles. Array 604 preferably includes differential (and asymmetric about at least one axis) layout structures for characterizing Y-overlay (or X-overlay). At least two differential columns (or rows) of FETs (e.g., 8-10 FETs in each) are included. FETs in each column have Y (or X) displacement of $\Delta$=(overlay range)/(N−1). The overlay range=2*maximum overlay.

An active area in each row is displaced by a $\Delta$ amount. Gate current and drain-to-source current may be measured for each FET. Y-overlay, i.e., gate shift may be the same in both the columns with possible compensation, if needed. Y displacement in the last row=(N−1)$\Delta$. Characterizing X overlay includes differential layout structures including two different rows of FETs (e.g., 8-10 FETs in each). The FETs in each row have an X displacement of $\Delta$=(overlay range)/(N−1), and the X displacement in last column=(N−1)$\Delta$.

For electrical characterization of the overlay, the $\Delta$ of the row FET for which two columns give a same current is the overlay. Other asymmetric (trapezoid, etc.) active area structures or other structures can be also used.

In one embodiment, built-in circuits such as circuits 300 or 400 may be formed on the wafer or die 602. A tester 606 interacts with the wafer or die 602 to provide signals to the array 604 or circuit 300, 400 so that a determination may be made as to a position of a transition. The tester 606 may include a processor or processor-like machine. The tester 606 reads needed electrical characteristic signals, for example, $I_g$, a Vout signal (from circuit 300), a Vout1 and Vout2 signals (from circuit 400), etc. The tester 606 uses the data to compute a zero crossing, or otherwise compute a corresponding device position, and further determine the overlay based on the identity of the corresponding device. The tester 606 may include memory 608 for storing overlay data and/or electrical characteristics. The data obtained can be employed to separate out effects of lithography from other issues by providing a direct correlation of overlay to electrical characteristics. A comparison device may be provided in tester 606 to make a determination for overlay, or the built-in circuits may include a comparison device configured to determine the overlay.

Having described preferred embodiments for differential FET structures for electrical monitoring of overlay and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for determining overlay, comprising:
   providing an array of electronic devices having structures formed in a plurality of layers and such that a device on a first end of the array includes an offset from a position of a device on a second end of the array;
   measuring electrical characteristics of the devices in the array to determine a transition position in the electrical characteristics; and
   determining an overlay between the layers based on a device associated with the transition position.

2. The method as recited in claim 1, wherein the array includes at least two columns and determining the overlay includes determining a Y-overlay.

3. The method as recited in claim 1, wherein the array includes at least two rows and determining the overlay includes determining an X-overlay.

4. The method as recited in claim 1, wherein the devices include field effect transistors and measuring electrical characteristics of the devices includes measuring one of gate current and drain to source current.

5. The method as recited in claim 4, wherein the transition position includes an intersection on a plot of current between devices at two positions in the array and measuring electrical characteristics of the devices in the array includes determining a shift in the intersection point.

6. The method as recited in claim 1, wherein providing an array of electronic devices includes forming shapes in patterned layers to adjust measured electrical characteristics.

7. The method as recited in claim 6, wherein forming shapes includes forming shapes such that the shapes have at least one axis of asymmetry and a first shape is reversed from an adjacent shape in a next row or column.

8. The method as recited in claim 1, wherein providing an array of electronic devices includes forming shapes in at least one of active area regions, gates and contacts to adjust measured electrical characteristics.

* * * * *